(12) United States Patent
Lee et al.

(10) Patent No.: US 10,910,477 B2
(45) Date of Patent: Feb. 2, 2021

(54) DISPLAY DEVICE AND METHOD OF MANUFACTURING THE SAME

(71) Applicant: Samsung Display Co., LTD., Yongin-si (KR)

(72) Inventors: Jongchan Lee, Suwon-si (KR);
Taehoon Yang, Yongin-si (KR);
Woonghee Jeong, Seoul (KR);
Kyoungwon Lee, Seoul (KR); Yongsu Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/781,081

(22) Filed: Feb. 4, 2020

(65) Prior Publication Data
US 2020/0176576 A1    Jun. 4, 2020

Related U.S. Application Data

(62) Division of application No. 15/870,095, filed on Jan. 12, 2018, now Pat. No. 10,593,770.

(30) Foreign Application Priority Data

Jun. 16, 2017   (KR) ................. 10-2017-0076768

(51) Int. Cl.
*H01L 21/44* (2006.01)
*H01L 21/02* (2006.01)
(Continued)

(52) U.S. Cl.
CPC ...... *H01L 29/41783* (2013.01); *H01L 27/127* (2013.01); *H01L 27/1222* (2013.01);
(Continued)

(58) Field of Classification Search
CPC .................................. H01L 29/41783
(Continued)

(56) References Cited

U.S. PATENT DOCUMENTS

| 5,434,433 A |   | 7/1995 | Takasu et al. |
|---|---|---|---|
| 5,536,950 A | * | 7/1996 | Liu .......... H01L 27/1214 257/59 |

(Continued)

FOREIGN PATENT DOCUMENTS

| KR | 10-0192470 | 1/1999 |
|---|---|---|
| KR | 10-1281167 | 6/2013 |

*Primary Examiner* — Calvin Lee
(74) *Attorney, Agent, or Firm* — Kile Park Reed & Houtteman PLLC

(57) ABSTRACT

A display device includes a first insulation layer on a first gate electrode, an active pattern on the first insulation layer and including an NMOS area and a PMOS area, the PMOS area overlapping the first gate electrode, a second insulation layer on the active pattern. The active pattern includes an NMOS area and a PMOS area, with the PMOS area overlapping the first gate electrode. In addition, a second gate electrode is on the second insulation layer and overlaps the NMOS area. An active-protecting pattern is in the same layer as the second gate electrode and passes through the second insulation layer to contact the PMOS area. A third insulation layer is on the active-protecting pattern and the second gate electrode. A data metal electrode passes through the third insulation layer and contacts the active-protecting pattern.

7 Claims, 17 Drawing Sheets

(51) Int. Cl.
    *H01L 29/417*     (2006.01)
    *H01L 29/66*     (2006.01)
    *H01L 27/12*     (2006.01)
    *H01L 29/786*     (2006.01)

(52) U.S. Cl.
    CPC .... *H01L 27/1251* (2013.01); *H01L 29/66575* (2013.01); *H01L 29/66696* (2013.01); *H01L 29/78675* (2013.01); *H01L 29/78678* (2013.01)

(58) Field of Classification Search
    USPC .......................... 257/340, 382; 438/233, 672
    See application file for complete search history.

(56) References Cited

U.S. PATENT DOCUMENTS

| | | |
|---|---|---|
| 6,767,772 B2 | 7/2004 | Takenaka |
| 7,595,859 B2 | 9/2009 | Park |
| 10,593,770 B2 * | 3/2020 | Lee ...................... H01L 27/127 |

\* cited by examiner

US 10,910,477 B2

DISPLAY DEVICE AND METHOD OF MANUFACTURING THE SAME

CROSS-REFERENCE TO RELATED APPLICATION

This is a divisional application based on currently U.S. patent application Ser. No. 15/870,095, filed on Jan. 12, 2018, now U.S. Pat. No. 10,593,770 issued Mar. 17, 2020 the disclosure of which is incorporated herein by reference in its entirety. U.S. patent application Ser. No. 15/870,095 claims priority benefit of Korean Patent Application No. 10-2017-0076768, filed on Jun. 16, 2017 in the Korean Intellectual Property Office and entitled, "Display Device and Method of Manufacturing the Same," the disclosure of which is incorporated herein by reference in its entirety for all purposes.

BACKGROUND

1. Field

One or more embodiments described herein relate to a display device a method for manufacturing a display device.

2. Description of the Related Art

A variety of displays have been developed. Examples include liquid crystal displays and organic light-emitting displays. The pixels of these displays include thin film transistors. The channel materials for these transistors include amorphous silicon, polycrystalline silicon (polysilicon), or oxide semiconductor. Polysilicon has relatively high carrier mobility and is used to form PMOS or NMOS transistors based on carrier charge or dopant. Attempts are continually being made to increase screen resolution the increasing the integration of wirings and reducing the sizes of thin film transistors. Also, the use of complementary metal oxide (CMOS) technology has been proposed.

SUMMARY

In accordance with one or more embodiments, a display device includes a first gate electrode; a first insulation layer on the first gate electrode; an active pattern on the first insulation layer and including an NMOS area and a PMOS area, the PMOS area overlapping the first gate electrode; a second insulation layer on the active pattern; a second gate electrode on the second insulation layer and overlapping the NMOS area; an active-protecting pattern in a same layer as the second gate electrode and passing through the second insulation layer and contacting the PMOS area; a third insulation layer on the active-protecting pattern and the second gate electrode; and a data metal electrode passing through the third insulation layer and contacting the active-protecting pattern. The PMOS area may include a p-channel area, a first p-doped area, and a second p-doped area spaced apart from the first p-doped area, and the active-protecting pattern may include a first active-protecting pattern contacting the first p-doped area and a second active-protecting pattern contacting the second p-doped area.

The display device may include a channel-protecting pattern between the first active-protecting pattern and the second active-protecting pattern and overlapping the p-channel area. The display device may include a drain electrode connected to the PMOS area or the NMOS area; and an organic light-emitting diode electrically connected to the drain electrode. The display device may include a lower capacitor electrode in a same layer as the first gate electrode; and an upper capacitor electrode overlapping the lower capacitor electrode and in a same layer as the second gate electrode.

The lower capacitor electrode may be electrically connected to the drain electrode, and the upper capacitor electrode may be electrically connected to the second gate electrode. The lower capacitor electrode may be electrically connected to the first gate electrode, and the upper capacitor electrode may be electrically connected to the drain electrode. A thickness of the third insulation layer may be greater than a thickness of the first insulation layer and the second insulation layer.

The active-protecting pattern may include a material having a work function higher than the data metal electrode. The active-protecting pattern may include at least one of silver, nickel, tungsten, copper, chromium, and molybdenum. The data metal electrode may include at least one of magnesium, tantalum, titanium, and aluminum.

In accordance with one or more other embodiments, a method for manufacturing a display device includes forming a lower gate metal pattern including a first gate electrode; forming a first insulation layer on the lower gate metal pattern; forming a semiconductor pattern on the first insulation layer, the semiconductor pattern including a first active area and a second active area spaced apart from the first active area, the first active area overlapping the first gate electrode; forming a second insulation layer on the semiconductor pattern; forming a PMOS area by doping the first active area; forming an NMOS area by doping the second active area; forming an upper gate metal pattern on the second insulation layer, the upper gate metal pattern including a second gate electrode and an active-protecting pattern contacting the PMOS area, the second gate electrode overlapping the NMOS area; forming a third insulation layer on the second gate electrode and the active-protecting pattern; and forming a data metal pattern including a data metal electrode passing through the third insulation layer to contact the active-protecting pattern.

Forming the PMOS area may include forming a first photoresist layer on the second insulation layer; etching the second insulation layer by using the first photoresist layer as a mask to partially expose the first active area; and providing p-typed impurities to an exposed portion of the first active area.

Forming the NMOS area may include forming an upper gate metal layer on the second insulation layer; forming a second photoresist layer on the upper gate metal layer; etching the upper gate metal layer by using the second photoresist layer as a mask to partially expose the second insulation layer; and providing n-typed impurities to a portion of the second active area through the second insulation layer.

Forming the upper gate metal pattern may include forming a third photoresist layer on a remaining upper gate metal layer; and etching the remaining upper gate metal layer using the third photoresist layer as a mask to form a first active-protecting pattern and a second active-protecting pattern spaced from the first active-protecting pattern.

The lower gate metal pattern may include a lower capacitor electrode, and the upper gate metal pattern may include an upper capacitor electrode overlapping the lower capacitor electrode. The lower capacitor electrode may be electrically connected to the first gate electrode. The upper capacitor electrode may be electrically connected to the second gate electrode. The active-protecting pattern may include a material having a work function higher than the data metal electrode. The active-protecting pattern may include at least one of silver, nickel, tungsten, copper, chromium, and molybdenum, and the data metal electrode includes at least one of magnesium, tantalum, titanium, and aluminum.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
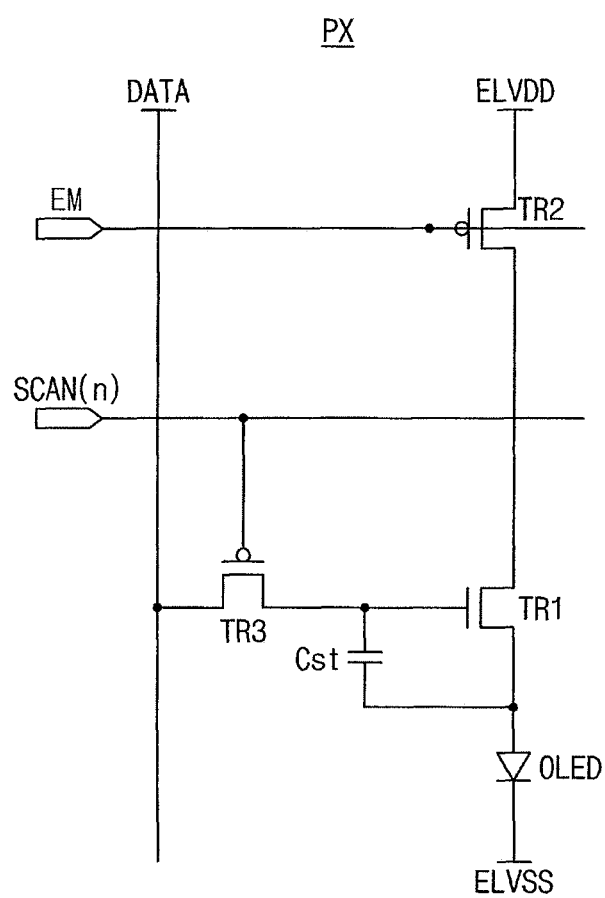
FIG. 1 illustrates an embodiment of a pixel.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a circuit embodiment of a pixel PX of a display device, which, for example, may be an organic light-emitting display device. The pixel PX may be representative of the circuit structure of an array of pixels of the display device.

Referring to FIG. 1, the pixel PX may include an organic light-emitting diode OLED, a first transistor TR1, a second transistor TR2, a third transistor TR3, and a storage capacitor Cst.

The organic light-emitting diode OLED may emit a light based on a driving current. The organic light-emitting diode OLED may include a first terminal and a second terminal. In an exemplary embodiment, the first terminal of the organic light-emitting diode OLED may receive a first power voltage ELVDD. The second terminal of the organic light-emitting diode OLED may receive a second power voltage ELVSS. In an exemplary embodiment, the first terminal may be an anode and the second terminal may be a cathode.

The first transistor TR1 may include a gate terminal, a first terminal, and a second terminal. The first terminal of the first transistor TR1 may be connected to the second transistor TR2. The second terminal of the first transistor TR1 may be connected to the organic light-emitting diode OLED. The gate terminal of the first transistor TR1 may be connected to the third transistor TR3.

The first transistor TR1 may generate the driving current based on the first power voltage ELVDD applied thereto. In an exemplary embodiment, gray scale may be implemented based on the amount of driving current provided to the organic light-emitting diode OLED. In one exemplary embodiment, a gray scale value of light may be implemented, for example, based on the summation of time during which the driving current is provided to the organic light-emitting diode OLED within one frame.

The second transistor TR2 may include a gate terminal, a first terminal, and a second terminal. The gate terminal may receive an emission signal EM. The first terminal may receive the first power voltage ELVDD. The second terminal may be connected to the first terminal of the first transistor TR1.

The second transistor TR2 may provide the first power voltage ELVDD to the first terminal of the first transistor TR1 during an active period of the emission signal EM. The second transistor TR2 may cut the first power voltage ELVDD during an inactive period of the emission signal EM. When the first power voltage ELVDD is provided to the first terminal of the first transistor TR1 during the active period of the emission signal EM, the first transistor TR1 may generate the driving current.

The third transistor TR3 may include a gate terminal, a first terminal, and a second terminal. The gate terminal may receive a scan signal Scan[n] from a scan line (or a gate line). The first terminal may be electrically connected to a data line to receive a data signal DATA. The second terminal may be connected to the gate terminal of the first transistor TR1.

The third transistor TR3 may provide the data signal DATA to the gate terminal of the first transistor TR1 during an active period of the scan signal Scan[n] of a current stage.

The storage capacitor Cst may be connected to and between the second terminal of the third transistor TR3 and the first terminal of the organic light-emitting diode OLED. Thus, the driving current generated by the first transistor TR1 may be provided to the organic light-emitting diode OLED based on a voltage level maintained by the storage capacitor Cst. In an exemplary embodiment, the first transistor TR1 may be an NMOS transistor and the second transistor TR2 and the third transistor TR3 may be PMOS transistors.

Figure 16:
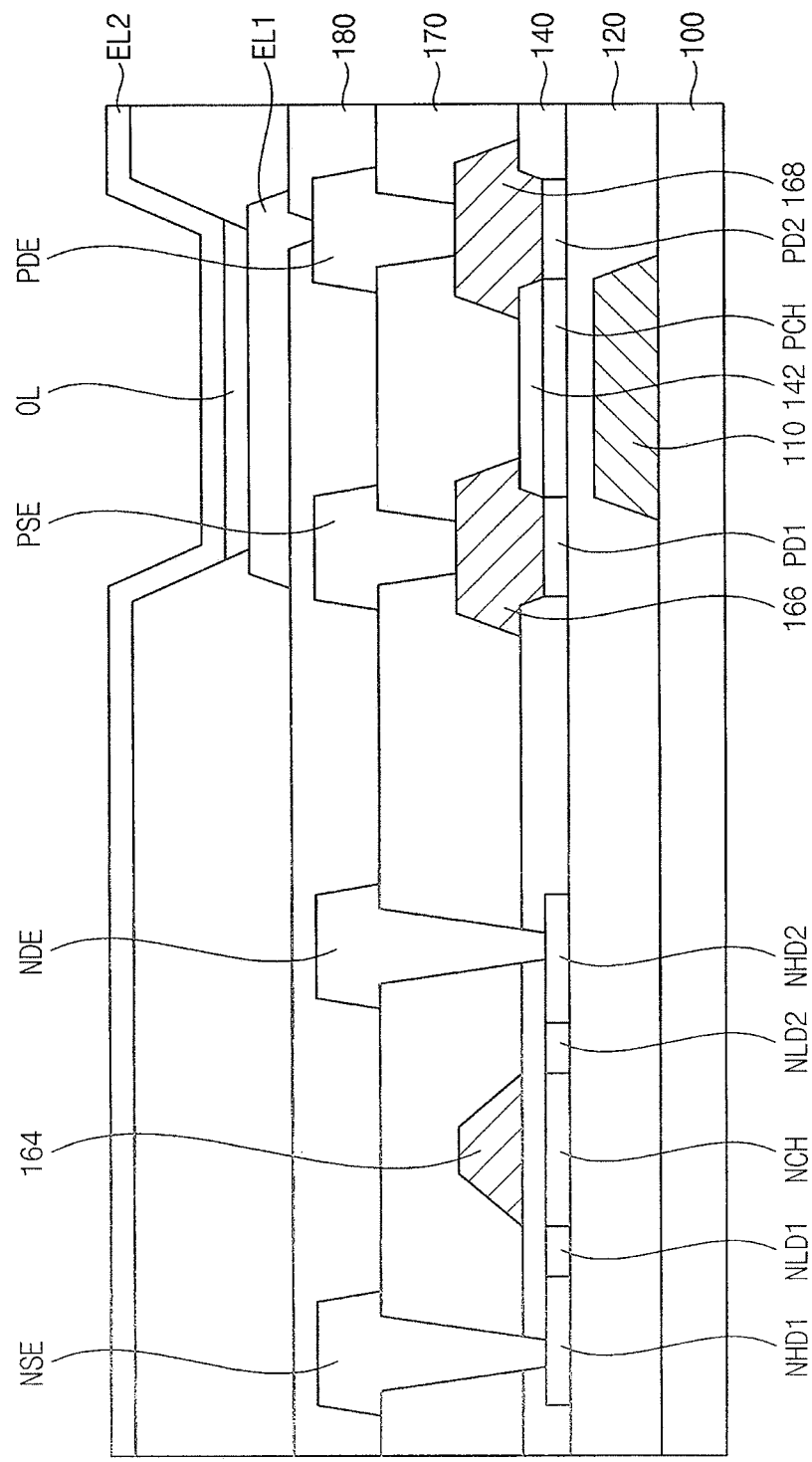
FIGS. 16 and 17 illustrate embodiments of a display device.
Figure 17:
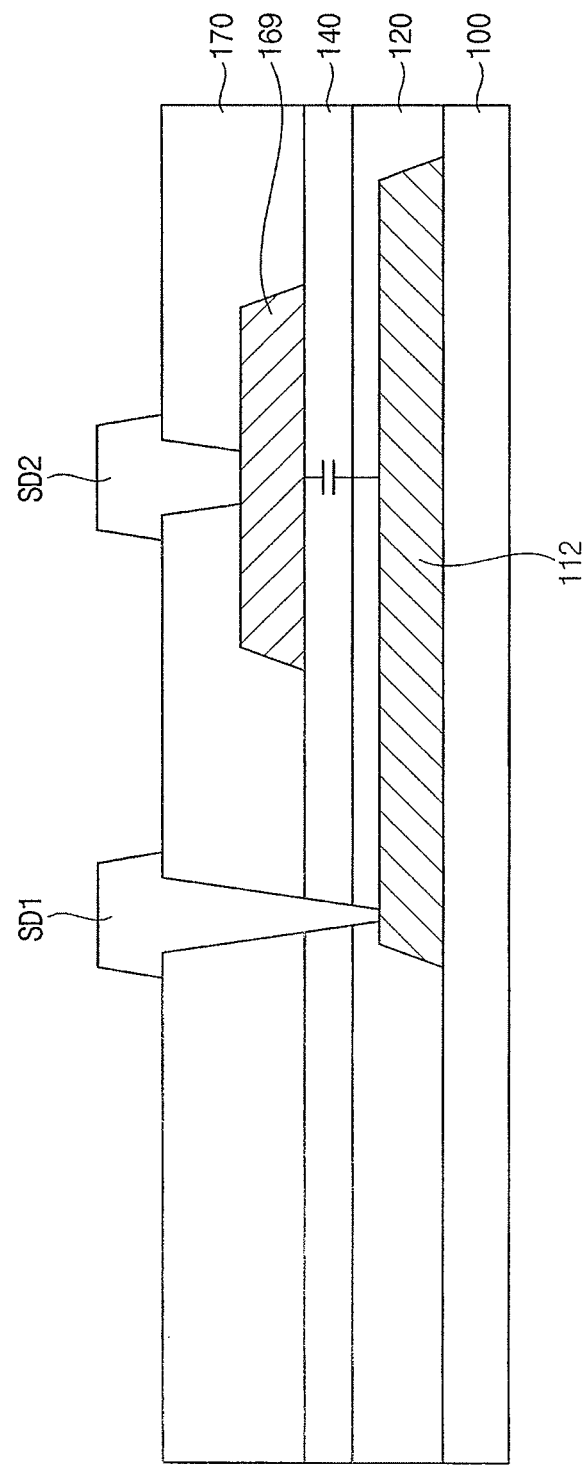

FIGS. 2 to 15 illustrate of an embodiment of a method for manufacturing a display device. FIGS. 16 and 17 illustrate embodiments of a display device. The views illustrated in FIGS. 2 to 17 are cross-sectional views. For example, cross-sections of the first transistor TR1 and the third transistor TR3 are illustrated, with the understanding that the second transistor TR2 may be manufactured by the same method as the third transistor TR3.

Figure 2:
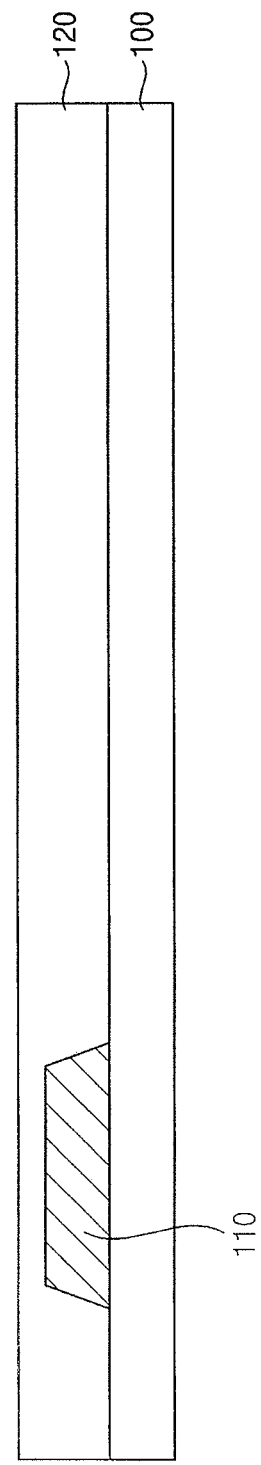
FIGS. 2 to 15 illustrate various stages of an embodiment of a method for manufacturing a display device.

Referring to FIG. 2, a first gate electrode 110 is formed on a base substrate 100. The base substrate 100 may include, for example, an insulating material such as glass, quartz, polymer, or another material. The polymer may include, for example, polyethylene terephthalate, polyethylene naphthalate, polyether ketone, polycarbonate, polyarylate, polyether sulfone, or polyimide.

The first gate electrode 110 may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The first gate electrode 110 may have a single-layered structure or a multiple-layered structure including different metal layers. In an exemplary embodiment, the first gate electrode 110 may be formed from a lower gate metal layer.

Thereafter, a first insulation layer 120 is formed to cover the first gate electrode 110. The first insulation layer 120 may include, for example, silicon oxide, silicon nitride, silicon carbide, or a combination thereof. The first insulation layer 120 may include an insulating metal oxide such as aluminum oxide, tantalum oxide, hafnium oxide, zirconium oxide, titanium oxide or the like. The first insulation layer 120 may have a single-layered structure or a multiple-layered structure including silicon nitride and/or silicon oxide.

Figure 3:
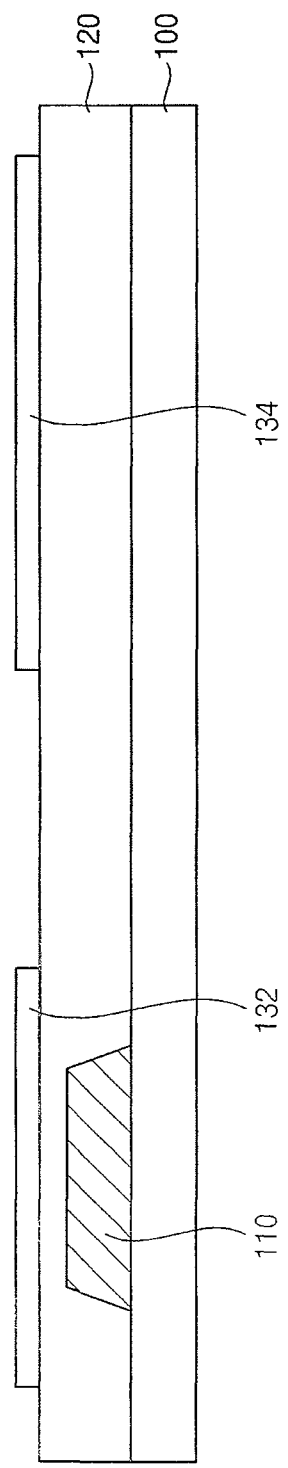

Referring to FIG. 3, a semiconductor pattern including a first active area 132 and a second active area 134 is formed on the first insulation layer 130. The first active area 132 may be spaced apart from the second active area 134, and may overlap the first gate electrode 110.

The semiconductor pattern may include, for example, polysilicon. In order to form the semiconductor pattern, an amorphous silicon layer may be formed on the first insulation layer 120 and then crystallized to form a polysilicon layer. The amorphous silicon layer may be formed, for example, through sputtering, low-pressure chemical vapor deposition (LPCVD), plasma-enhanced chemical vapor deposition (PECVD), or another suitable process. The amorphous silicon layer may be crystallized, for example, through excimer laser annealing (ELA) or sequential lateral solidification (SLS).

The polysilicon layer may be polished, for example, by chemical mechanical polishing (CMP) to planarize a surface thereof. Thereafter, the polysilicon layer may be patterned by a photolithography to form the semiconductor pattern. The semiconductor pattern may be doped with n-type impurities or p-type impurities to satisfy the intended application.

Figure 4:
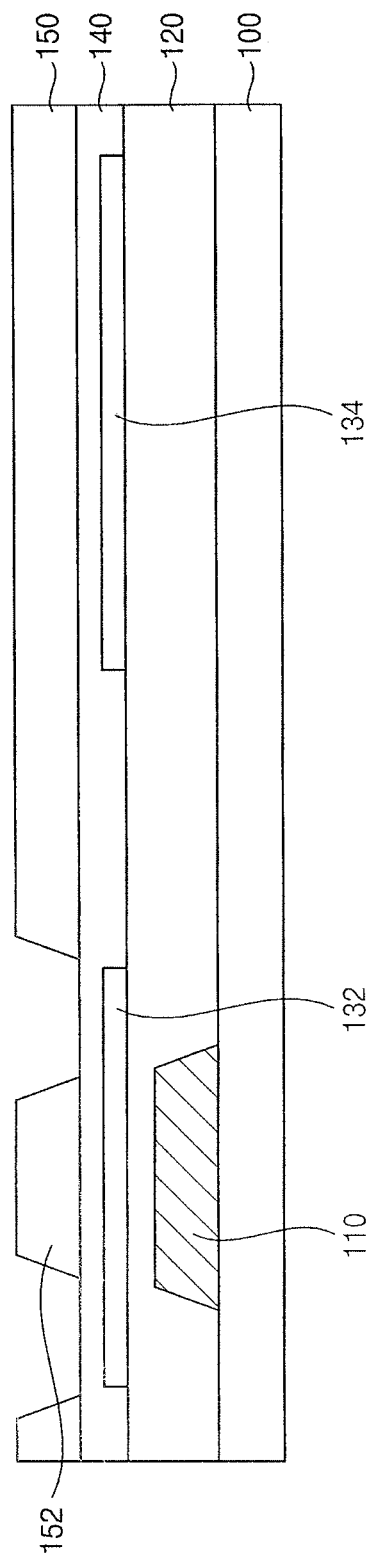

Referring to FIG. 4, a second insulation layer 140 is formed to cover the semiconductor pattern, and a first photoresist layer 150 is formed on the second insulation layer 140. The second insulation layer 140 may include, for example, silicon oxide, silicon nitride, silicon carbide, or a combination thereof. The second insulation layer 140 may include, for example, an insulating metal oxide such as aluminum oxide, tantalum oxide, hafnium oxide, zirconium oxide, or titanium oxide. The second insulation layer 140 may have a single-layered structure or a multiple-layered structure, for example, including silicon nitride and/or silicon oxide.

The first photoresist layer 150 is patterned by light-exposure and developing process to partially expose the second insulation layer 140. The first photoresist layer 150 may include, for example, a first mask pattern 152 partially overlapping the first active area 132. A photoresist composition including a binder resin (such as a phenol resin, an acryl resin, or the like) may be coated, exposed to a light, and developed to form the first photoresist layer 150.

Figure 5:
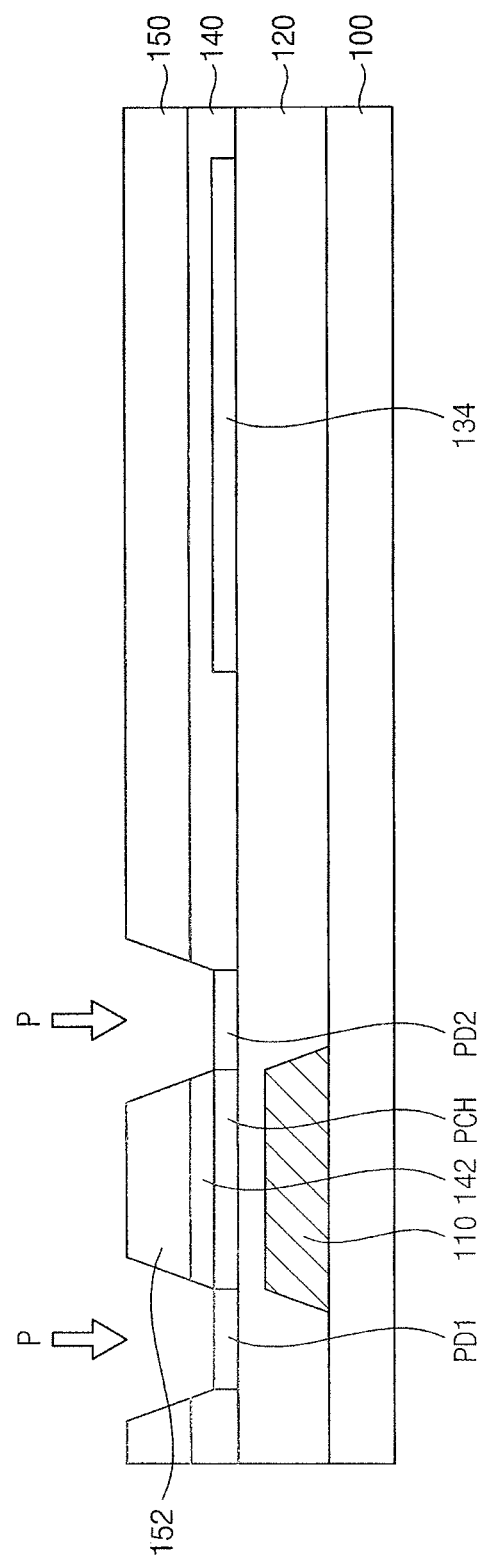

Referring to FIG. 5, the second insulation layer 140 is etched using the first photoresist layer 150 including the first mask pattern 152 to partially expose an upper surface of the first active area 132. A portion of the second insulation layer 140 between the first mask pattern 152 and the first active area 132 remains to form a channel-protecting pattern 142.

Thereafter, p-type impurities such as boron or the like may be provided to an exposed portion of the first active area 132. As a result, a portion overlapping the first mask pattern 152 in the first active area 132 remains without being doped to define a p-channel area PCH. A peripheral portion surrounding and adjacent to the p-channel area PCH is doped with p-type impurities to form a first p-doped area PD1 and a second p-doped area PD2.

Figure 6:
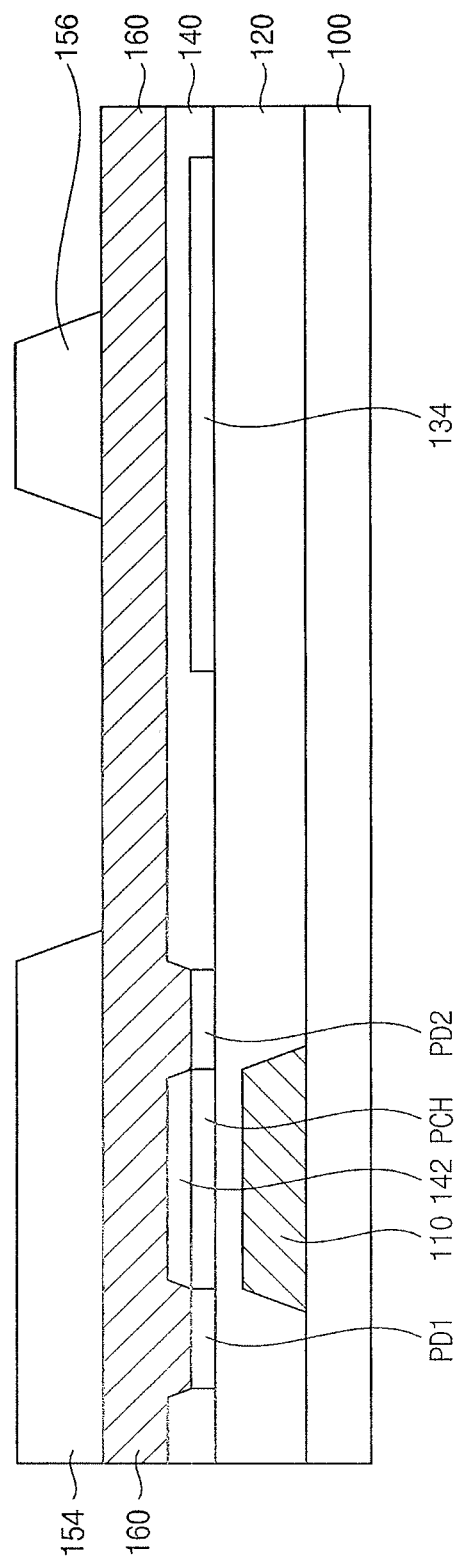

Referring to FIG. 6, the first photoresist layer 150 is removed, and an upper gate metal layer 160 is formed on the second insulation layer 140. A second photoresist layer 154 is formed on the upper gate metal layer 160. A portion of the upper gate metal layer 160 contacts upper surfaces of the first p-doped area PD1 and the second p-doped area PD2. The upper gate metal layer 160 may include, for example, the same material as the first gate electrode 110. In an exemplary embodiment, the upper gate metal layer 160 may include a metal having a relatively high work function, explained as follows.

The second photoresist layer 154 is patterned by light-exposure and developing process to partially expose the upper gate metal layer 160. The second photoresist layer 154 may include, for example, a second mask pattern 156 that partially overlaps the second active area 134.

Figure 7:
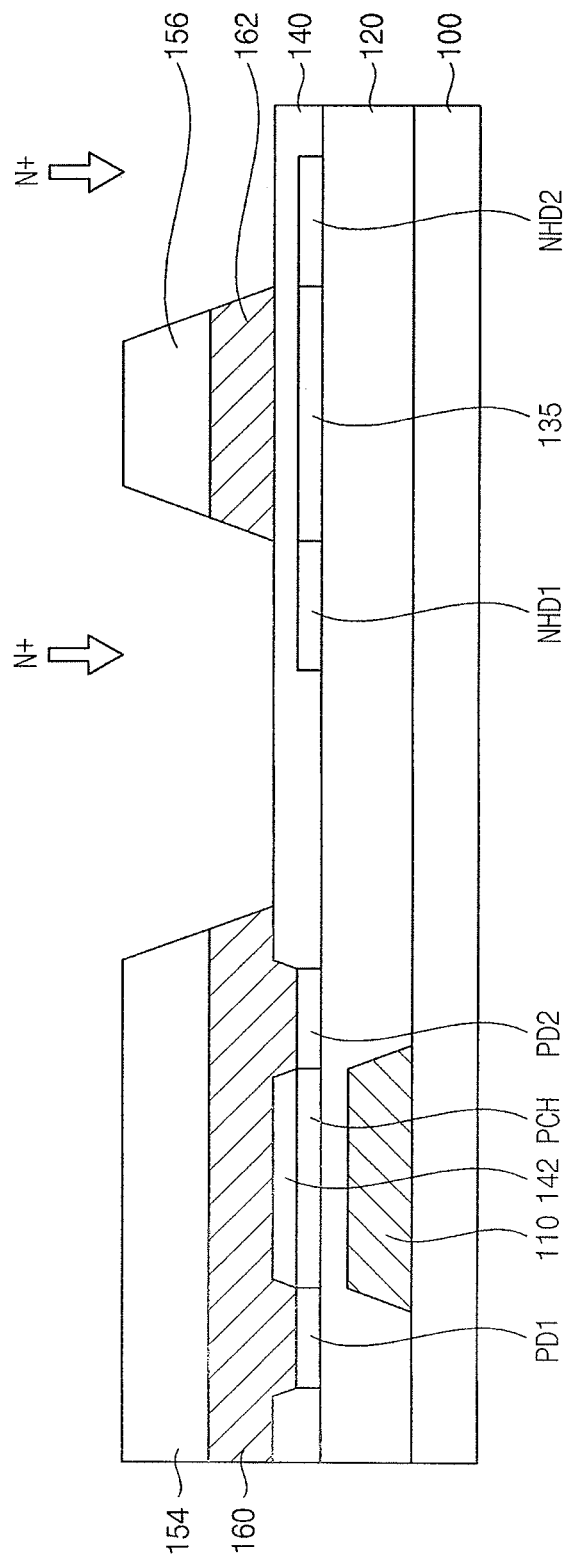

Referring to FIG. 7, the upper gate metal layer 160 is etched using the second photoresist layer 154 including the second mask pattern 156 to partially expose an upper surface of the second insulation layer 140, and to form a gate preliminary pattern 162 overlapping the second mask pattern 156.

Thereafter, n-type impurities such as phosphor, arsenic, or the like may be provided to the second active area 134 through an exposed portion of the second insulation layer 140 with a predetermined, relatively high concentration. In the second active area 134, an overlapping portion 135, which overlaps the gate preliminary pattern 162, is protected by the gate preliminary pattern 162 and allowed to remain without being doped. A peripheral portion of the second active area 134, which surrounds and is adjacent to the gate-overlapping portion 135, is doped with n-type impurities with a predetermined, relatively high concentration to form a first high-concentration n-doped area NHD1 and a second high-concentration n-doped area NHD2. A PMOS area, including the p-channel area PCH and the p-doped areas PD1 and PD2, is protected by the upper gate metal layer 160 remaining on the PMOS area. Thus, the PMOS area is not further doped with n-type impurities.

Figure 8:
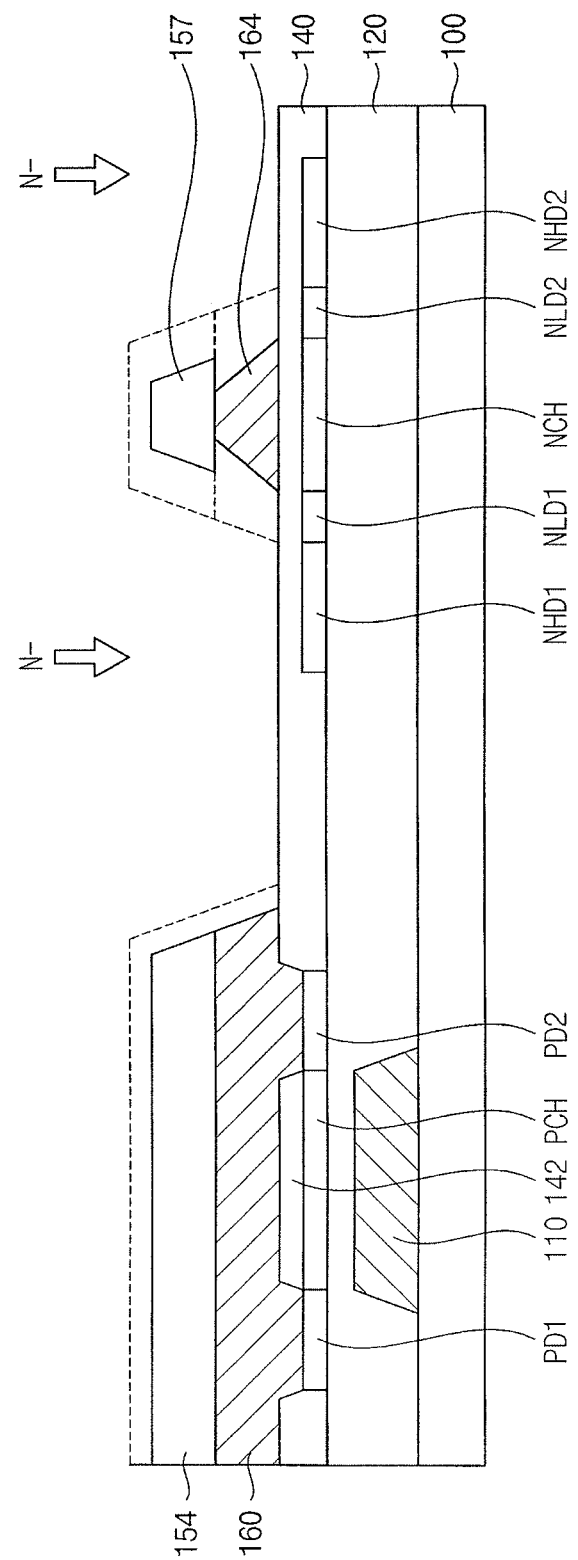

Referring to FIG. 8, the gate preliminary pattern 162 and the second mask pattern 156 are etched by an ashing process. As a result of the ashing process, the width of the gate preliminary pattern 162 is reduced to form a second gate electrode 164. The ashing process may etch a side surface of the gate preliminary pattern 162 to form a skew. Thus, the second gate electrode 164 may have a tapered angle smaller than the gate preliminary pattern 162. The tapered angle may be, for example, an angle between a lower surface and a side surface of a metal pattern.

As a result of the ashing process, the width of the gate preliminary pattern 162 is reduced to expose the second insulation layer 140 in an area surrounding or adjacent to the second gate electrode 164.

The ashing process may be performed, for example, using plasma. The ashing process may etch a metal, an inorganic insulating material, and an organic insulating material like a dry-etching process. Thus, the gate preliminary pattern 162, the second photoresist layer 154 including the second mask pattern 156, and the second insulation layer 140 may be partially etched by the ashing process.

Thereafter, n-type impurities such as phosphor, arsenic, or the like may be provided to the gate-overlapping portion 135 through an exposed portion of the second insulation layer 160 with a predetermined, relatively low concentration. Thus, a peripheral portion of the gate-overlapping portion 135, which does not overlap the second gate electrode 164, is doped with n-type impurities with a predetermined, relatively low concentration to form a first low-concentration n-doped area NLD1 and a second low-concentration n-doped area NLD2. In the gate-overlapping portion 135, a portion overlapping the second gate electrode 164 is protected by the second gate electrode 164. Thus, the portion remains without being doped to define an n-channel area NCH. An area including the n-channel area NCH and the n-doped areas NLD1, NLD2, NHD1 and NHD2 may be referred as an NMOS area.

The process for providing the n-type impurities with a predetermined, relatively low concentration may be performed after or before the second photoresist layer 154 including a remaining mask pattern 157 are removed.

The length of the first low-concentration n-doped area NLD1 and the second low-concentration n-doped area NLD2 may vary depending, for example, on the manufacturing process and desired device characteristics. In one example embodiment, the length of the first low-concentration n-doped area NLD1 and the second low-concentration n-doped area NLD2 may be about 0.2 μm to about 2 μm.

Figure 9:
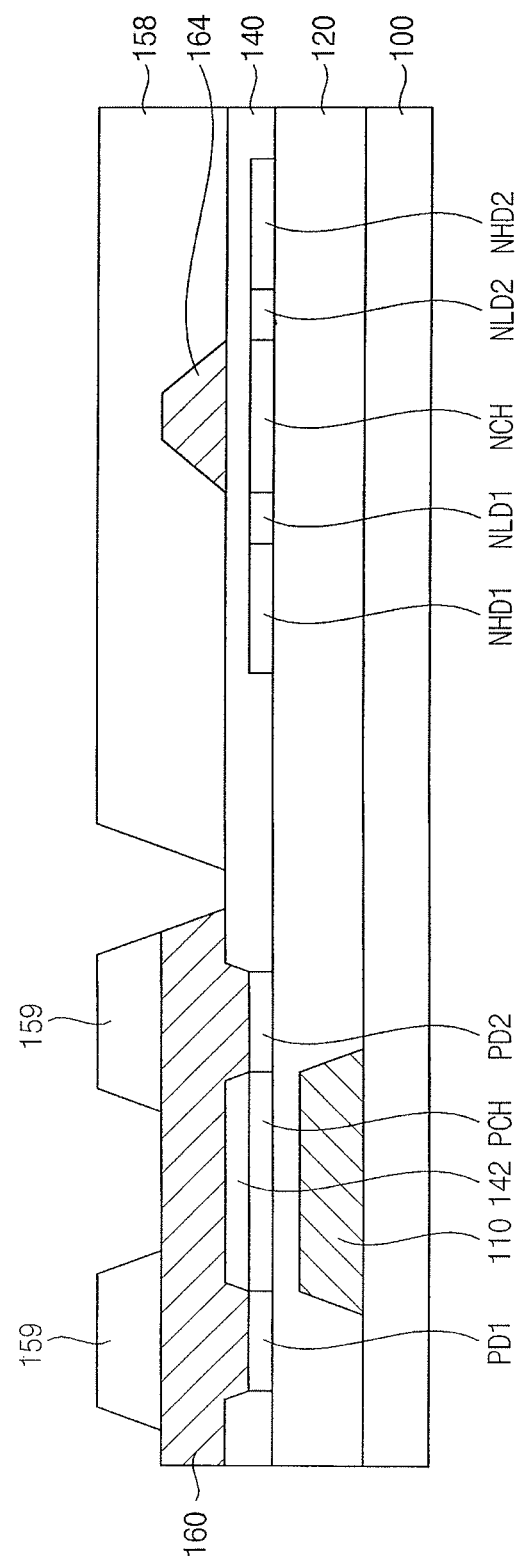

Referring to FIG. 9, a third photoresist layer 158 is formed to cover the second insulation layer 140, the second gate electrode 164, and the upper gate metal layer 160. The third photoresist layer 158 may be patterned by light-exposure and a developing process to partially expose the upper gate metal layer 160. The third photoresist layer 158 may include, for example, a third mask pattern 159 overlapping the p-doped areas PD1 and PD2

Figure 10:
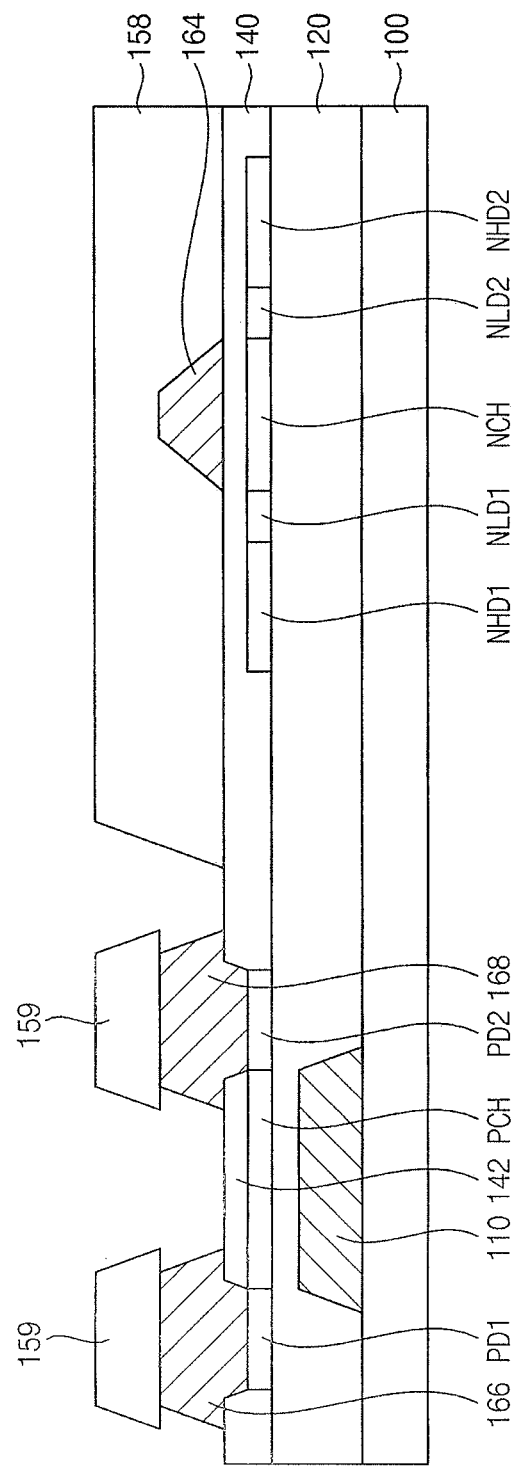

Referring to FIG. 10, the upper gate metal layer 160 is etched using the third photoresist layer 158 including the third mask pattern 159 as a mask to partially expose an upper surface of the second insulation layer 140, and to form an active-protecting pattern overlapping the third mask pattern 159. The active-protecting pattern may include a first active-protecting pattern 166 contacting an upper surface of the first p-doped area PD1, and a second active-protecting pattern 168 contacting an upper surface of the second p-doped area PD2.

The first active-protecting pattern 166 is spaced apart from the second active-protecting pattern 168. The channel-protecting pattern 142 is disposed between the first active-protecting pattern 166 and the second active-protecting pattern 168. Thus, an upper surface of the channel-protecting pattern 142 may be exposed. For example, at least a portion of the first active-protecting pattern 166 and the second active-protecting pattern 168 may contact an upper surface of the second insulation layer 140.

Figure 11:
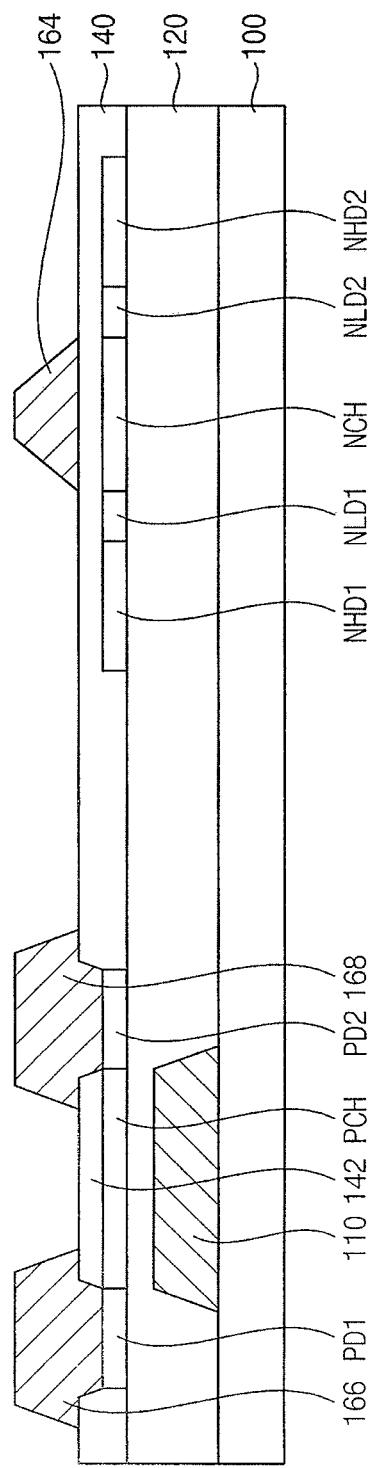
Figure 12:
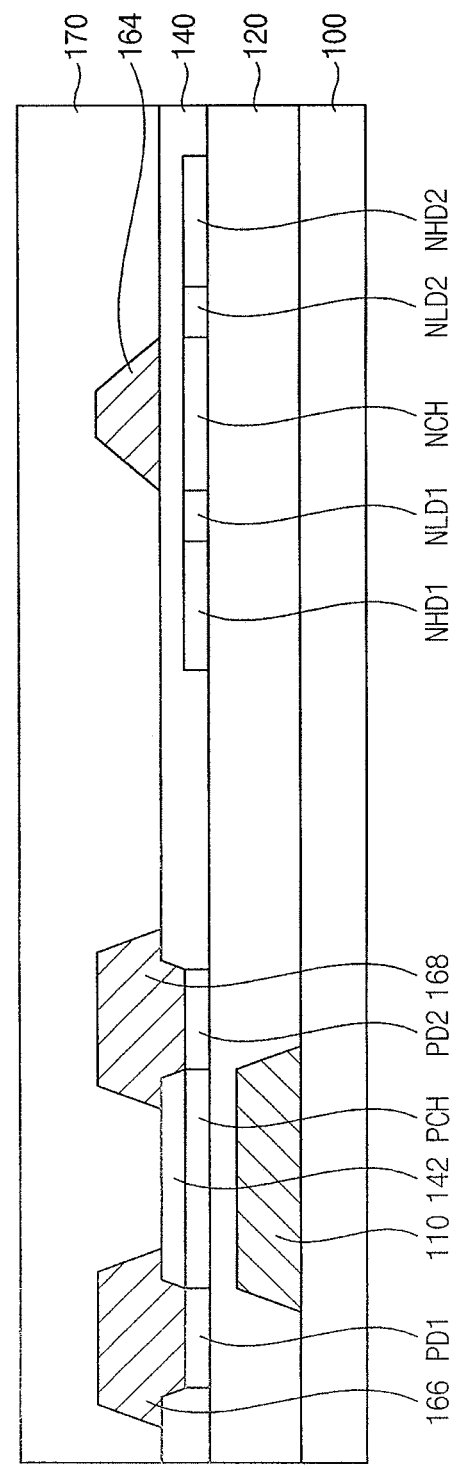

Referring to FIGS. 11 and 12, the third photoresist layer 158 including the third mask pattern 159 is removed, and a third insulation layer 170 is formed to cover the first active-protecting pattern 166, the second active-protecting pattern 168, and the second gate electrode 164. The third insulation layer 170 may include, for example, silicon oxide, silicon nitride, silicon carbide, or a combination thereof. The third insulation layer 170 may include, for example, an insulating metal oxide such as aluminum oxide, tantalum oxide, hafnium oxide, zirconium oxide, or titanium oxide. The third insulation layer 170 may have a single-layered structure or a multiple-layered structure including silicon nitride and/or silicon oxide. When the third insulation layer 170 includes an organic insulating material or further includes an organic insulation layer, the third insulation layer 170 may include, for example, polyimide, polyamide, acryl resin, phenol resin, or benzocyclobutene.

Figure 13:
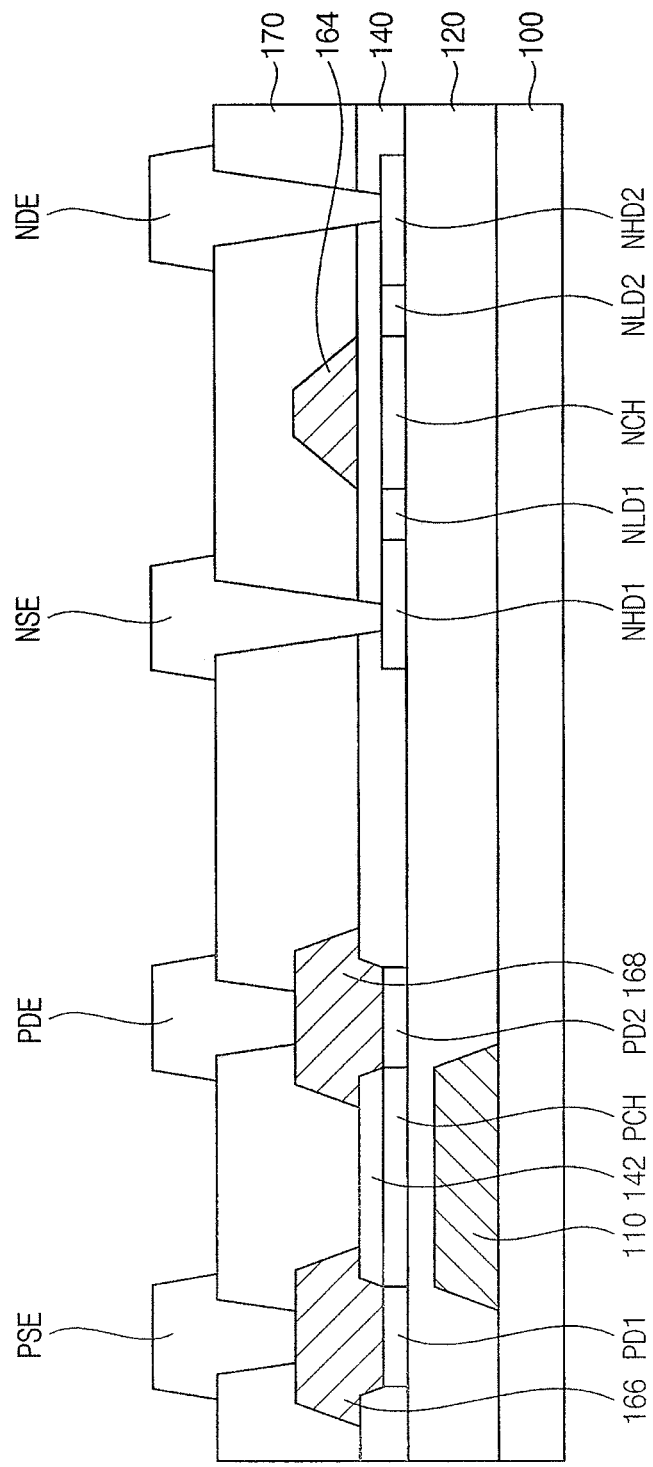
Figure 14:
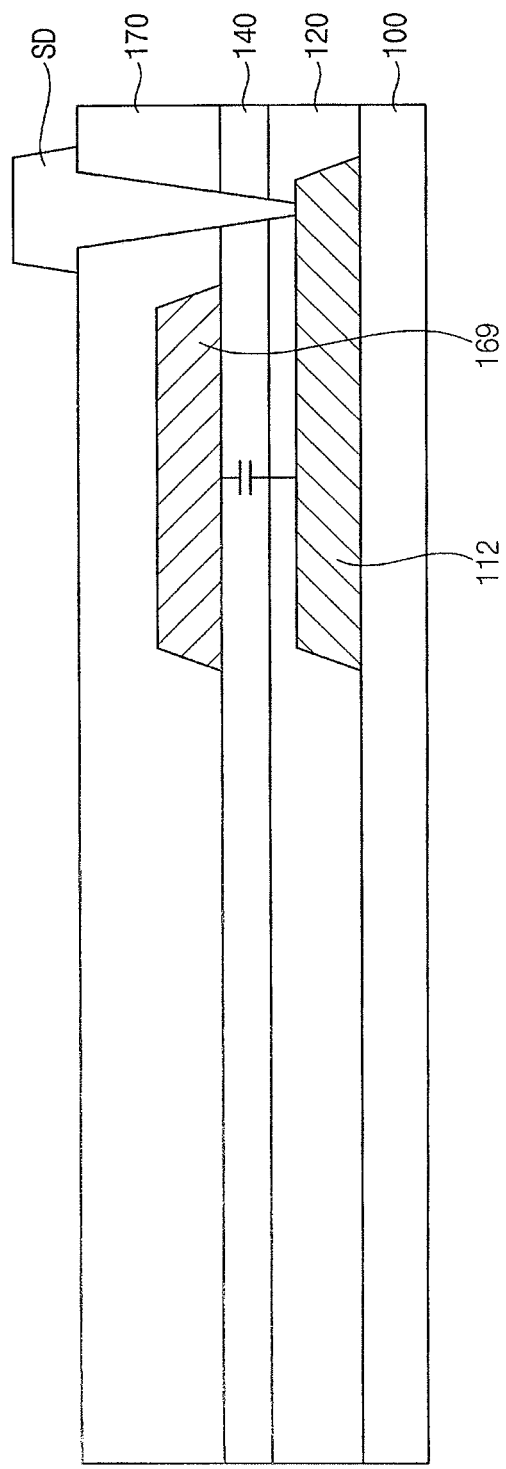

Referring to FIG. 13, the first insulation layer 120, the second insulation layer 140, and the third insulation layer 170 are patterned to form through-holes exposing the first p-doped area PD1, the second p-doped area PD2, the first high-concentration n-doped area NHD1, and the second high-concentration n-doped area NHD2.

Thereafter, a data metal layer is formed on the third insulation layer 170 and patterned to form a data metal pattern, including a first source electrode PSE, a first drain electrode PDE, a second source electrode NDE, and a second drain electrode NDE. The first source electrode PSE contacts the first p-doped area PD1. The first drain electrode PDE contacts the second p-doped area PD2. The second source electrode NSE contacts the first high-concentration n-doped area NHD1. The second drain electrode NDE contacts the second high-concentration n-doped area NHD2. The source electrodes and the drain electrodes may be referred to as data metal electrodes. In one embodiment, the data metal pattern may further include a data line or the like.

The data metal pattern may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The data metal pattern may have a single-layered structure or a multiple-layered structure including different metal layers.

In an exemplary embodiment, the active-protecting patterns 166 and 168 may include a metal having a work function higher than the data metal pattern. The active-protecting patterns 166 and 168 may include, for example, silver, nickel, tungsten, copper, chromium, or molybdenum when the data metal pattern includes magnesium, tantalum, titanium, or aluminum.

When the data metal pattern includes a metal having a relatively low work function, contact resistance between the source/drain electrodes and the doped areas may be increased. In an exemplary embodiment, the active-protecting patterns 166 and 168 may include a material having a work function higher than the data metal pattern, so that contact resistance between the source/drain electrodes and the doped areas may be reduced. Thus, a characteristic of a TFT may be improved.

According to an exemplary embodiment, a capacitor may be formed using the lower gate metal layer and the upper gate metal layer. For example, referring to FIG. 14, a lower gate metal pattern formed from the lower gate metal layer may include a lower capacitor electrode 112. An upper gate metal pattern formed from the upper gate metal layer may include an upper capacitor electrode 169. The data metal pattern may further include a connection electrode SD contacting the lower capacitor electrode 112.

The lower capacitor electrode 112 may be electrically connected, for example, to the drain electrode NDE of the driving transistor. The upper capacitor electrode 169 may be electrically connected to the gate electrode 164 of the driving transistor to form the storage capacitor Cst illustrated in FIG. 1.

In an exemplary embodiment, the lower capacitor electrode 112 may be spaced apart from the upper capacitor electrode 169 by the first insulation layer 120 and the second insulation layer 140. In an exemplary embodiment, each of the first insulation layer 120 and the second insulation layer 140 may be a gate insulation layer. The third insulation layer 170 may be an interlayer insulation layer. Thus, the total thickness of the first insulation layer 120 and the second insulation layer 140 may be less than the thickness of the third insulation layer 170. Therefore, as the thickness of a dielectric layer of a capacitor is reduced, the capacitance of the capacitor may be increased.

Furthermore, when the capacitor electrodes are formed from gate metal layers in different layers for forming a stacked structure, the size of capacitor electrodes may be easily increased.

Figure 15:
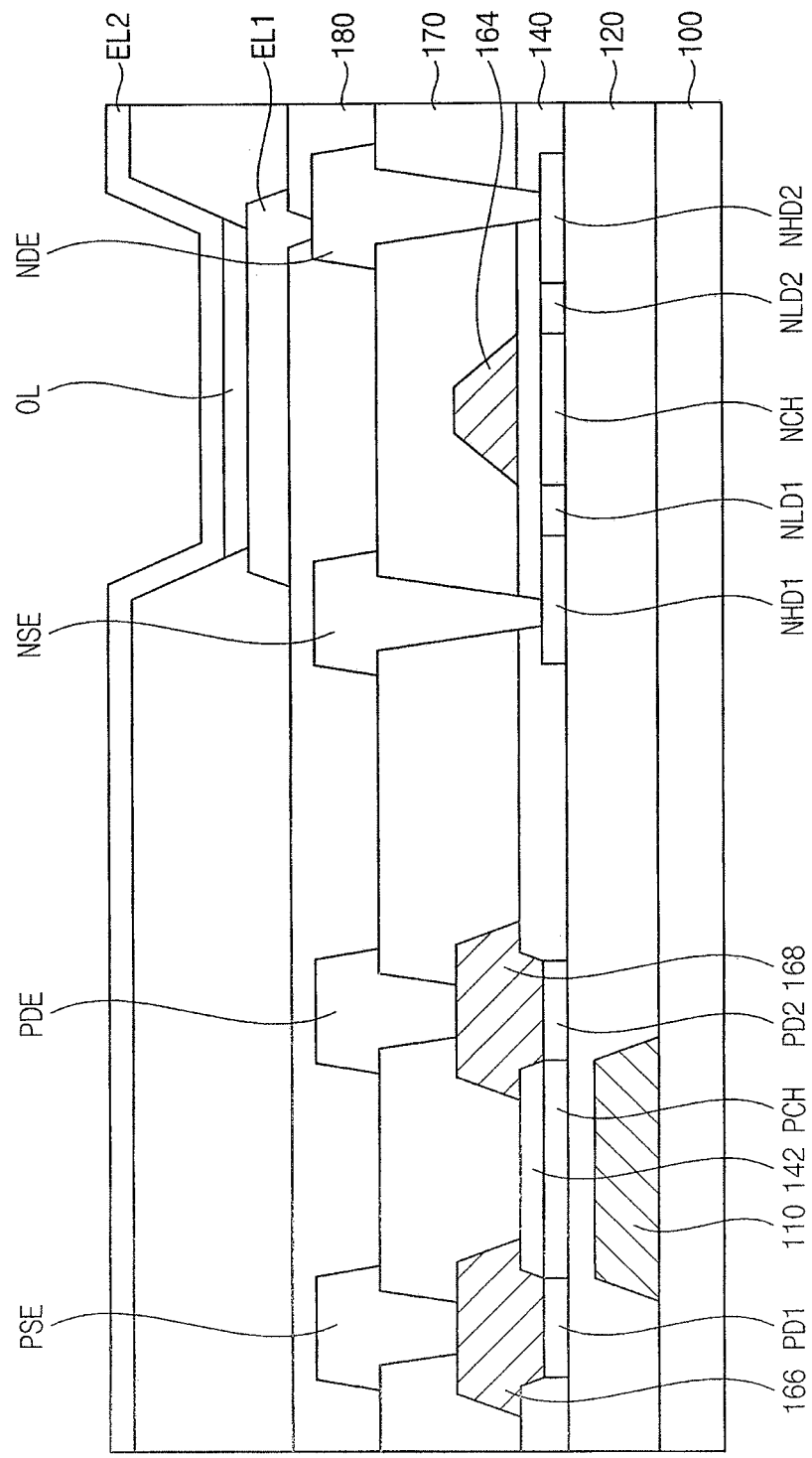

Referring to FIG. 15, a fourth insulation layer 180 is formed on the data metal pattern and patterned to expose the second drain electrode NDE. A first electrode metal layer is formed on the fourth insulation layer 180 and patterned to form a first electrode EL1 contacting the drain electrode NDE. The fourth insulation layer 180 may include, for example, an inorganic insulating material, an organic insulating material, or a combination thereof as previously described.

The first electrode EL1 may be a pixel electrode of the display device. The first electrode EL1 may be formed as a transmitting electrode or a reflecting electrode according to an emission type of the display device. When the first electrode EL1 is a transmitting electrode, the first electrode EL1 may include, for example, indium tin oxide, indium zinc oxide, zinc tin oxide, indium oxide, zinc oxide, or tin oxide. When the first electrode EL1 is a reflecting electrode, the first electrode EL1 may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof. The first electrode EL1 may have a stacked structure including material that may be used for the transmitting electrode.

A pixel-defining layer 180 is formed on the first electrode EL1 and the fourth insulation layer 180. The pixel-defining layer 180 includes an opening that exposes at least a portion of the first electrode EL1. The pixel-defining layer 180 may include, for example, an organic insulating material.

A light-emitting layer OL may be formed on the first electrode EL1. The light-emitting layer OL may include at least one of a plurality of functional layers such as a hole-injection layer, a hole-transporting layer, an organic light-emitting layer, an electron-transporting layer, or an electron-injecting layer. The light-emitting layer OL may have a single-layered structure and a multiple-layered structure.

The light-emitting layer OL may include a low molecular weight organic compound or a high molecular weight organic compound. Examples of the low molecular weight organic compound may include copper phthalocyanine, N,N'-diphenylbenzidine, (tris-(8-hydroxyquinoline)aluminum or the like. Examples of the high molecular weight organic compound may include poly(3,4-ethylenedioxythiophene), polyaniline, poly-phenylenevinylene, and polyfluorene.

In an exemplary embodiment, the light-emitting layer OL may emit red light, green light, blue light, or another color of light. The light-emitting layer OL emitting white light may have a multiple-layered structure including a red-emitting layer, a green-emitting layer, and a blue-emitting layer, or may have a single-layered structure including a mixture of a red-emitting material, a green-emitting material, and a blue-emitting material. The light-emitting layer OL may be formed, for example, through a screen printing process or an ink-jet printing process.

A second electrode EL2 may be formed on the light-emitting layer OL. The second electrode EL2 may be formed as a transmitting electrode or a reflecting electrode according to an emission type of the display device. For example, when the second electrode EL2 is a transmitting electrode, the second electrode EL2 may include lithium (Li), calcium (Ca), lithium fluoride (LiF), aluminum (Al), magnesium (Mg), or a combination thereof. In one embodiment, the display device may further include a sub electrode or a bus electrode line, which includes, for example, indium tin oxide, indium zinc oxide, zinc tin oxide, indium oxide, zinc oxide, or tin oxide.

In an exemplary embodiment, the organic light-emitting display device may have a front-emission type in which a light exits through the second electrode EL2. In one exemplary embodiment, the organic light-emitting display device may have a rear-emission type in which a light exits in an opposing direction.

According to an exemplary embodiment, in a display device including a CMOS structure of transistors, a gate electrode of an NMOS transistor and a gate electrode of a PMOS transistor are formed in different layers. Thus, the degree of freedom for designing a gate metal pattern may be improved. Also, interference and defects due to adjacent wirings may be reduced or prevented.

Furthermore, an NMOS area and a PMOS area in an active pattern may be formed from a same semiconductor layer. Thus, a semiconductor pattern forming a CMOS transistor may be formed in a same process.

Furthermore, an active-protecting pattern for protecting a doped area of the PMOS transistor may be formed using a gate metal layer used for forming an upper gate electrode.

Furthermore, when the active-protecting pattern is formed from a metal having a relatively high work function, a contact resistance between source/drain electrodes and doped areas may be reduced.

According to an exemplary embodiment, a NMOS transistor may be a driving transistor electrically connected to the organic light-emitting diode and a PMOS transistor may be a switching transistor to switch the driving transistor. In one exemplary embodiment, a PMOS transistor may be used for the driving transistor and an NMOS transistor may be used for the switching transistor.

For example, as illustrated in FIG. 16, a drain electrode PDE connected to a PMOS area may be electrically connected to an organic light-emitting diode so that a PMOS transistor may function as a driving transistor.

In the display device, for example, as illustrated in FIG. 17, a lower capacitor electrode 112 may be electrically connected to a drain electrode NDE of an NMOS transistor through a first connection electrode SD1. Furthermore, the lower capacitor electrode 112 may be electrically connected to a gate electrode of the PMOS transistor. An upper capacitor electrode 169 may be electrically connected to a drain electrode PDE of the PMOS transistor through a second connection electrode SD2 to form a storage capacitor Cst.

Furthermore, exemplary embodiments are not limited to a pixel circuit including three transistors, and may be used for a pixel circuit including two transistors or more than three transistors. For example, in one exemplary embodiment, a display device may include a pixel circuit having a 2T-1C configuration not including an emission transistor. In the 2T-1C configuration, a driving transistor for providing current to an organic light-emitting diode may be one of an NMOS transistor and a PMOS transistor, and a switching transistor for operating the driving transistor may be the other of the NMOS transistor and the PMOS transistor.

Furthermore, exemplary embodiments may be used for circuits other than pixel circuits, e.g., a gate driving circuit, a data driving circuit, or another type of circuit. Furthermore, exemplary embodiments may be used for an organic light-emitting display device, or another type of display device including but not limited to liquid crystal display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for manufacturing a display device, the method comprising:
    forming a lower gate metal pattern including a first gate electrode;
    forming a first insulation layer on the lower gate metal pattern;
    forming a semiconductor pattern on the first insulation layer, the semiconductor pattern including a first active area and a second active area spaced apart from the first active area, the first active area overlapping the first gate electrode;
    forming a second insulation layer on the semiconductor pattern;
    forming a PMOS area by doping the first active area;
    forming an NMOS area by doping the second active area;
    forming an upper gate metal pattern on the second insulation layer, the upper gate metal pattern including a second gate electrode and an active-protecting pattern contacting the PMOS area, the second gate electrode overlapping the NMOS area;
    forming a third insulation layer on the second gate electrode and the active-protecting pattern; and
    forming a data metal pattern including a data metal electrode passing through the third insulation layer to contact the active-protecting pattern, wherein:
    the lower gate metal pattern includes a lower capacitor electrode, and
    the upper gate metal pattern includes an upper capacitor electrode overlapping the lower capacitor electrode.

2. The method as claimed in claim 1, wherein the upper capacitor electrode is electrically connected to the second gate electrode.

3. The method as claimed in claim 1, wherein the lower capacitor electrode is electrically connected to the first gate electrode.

4. A display device, comprising:
    a first gate electrode;
    a first insulation layer on the first gate electrode;
    an active pattern on the first insulation layer and including an NMOS area and a PMOS area, the PMOS area overlapping the first gate electrode;
    a second insulation layer on the active pattern;
    a second gate electrode on the second insulation layer and overlapping the NMOS area;
    an active-protecting pattern in a same layer as the second gate electrode and passing through the second insulation layer and contacting the PMOS area;
    a third insulation layer on the active-protecting pattern and the second gate electrode;
    a data metal electrode passing through the third insulation layer and contacting the active-protecting pattern;
    a drain electrode electrically connected to the PMOS area or the NMOS area;
    an organic light-emitting diode electrically connected to the drain electrode;
    a lower capacitor electrode in a same layer as the first gate electrode; and
    an upper capacitor electrode overlapping the lower capacitor electrode and in a same layer as the second gate electrode.

5. The display device as claimed in claim 1, wherein:
    the lower capacitor electrode is electrically connected to the drain electrode, and
    the upper capacitor electrode is electrically connected to the second gate electrode.

6. The display device as claimed in claim 1, wherein:
    the lower capacitor electrode is electrically connected to the first gate electrode, and
    the upper capacitor electrode is electrically connected to the drain electrode.

7. The display device as claimed in claim 1, wherein a thickness of the third insulation layer is greater than a thickness of the first insulation layer and the second insulation layer.

* * * * *